(12) United States Patent
Lee et al.

(10) Patent No.: US 11,003,265 B2
(45) Date of Patent: May 11, 2021

(54) TOUCH SENSOR INTEGRATED TYPE ELECTROLUMINESCENT DISPLAY DEVICE

(71) Applicant: LG DISPLAY CO., LTD., Seoul (KR)

(72) Inventors: Jaegyun Lee, Paju-si (KR); Jihyun Jung, Paju-si (KR); Buyeol Lee, Goyang-si (KR); Sangkyu Kim, Goyang-si (KR); Ruda Rhe, Seongnam-si (KR); Hyangmyoung Gwon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 44 days.

(21) Appl. No.: 15/796,386

(22) Filed: Oct. 27, 2017

(65) Prior Publication Data

US 2018/0120995 A1  May 3, 2018

(30) Foreign Application Priority Data

Oct. 28, 2016 (KR) .................. 10-2016-0142049
Sep. 18, 2017 (KR) .................. 10-2017-0119321

(51) Int. Cl.
| | |
|---|---|
| *G06F 3/041* | (2006.01) |
| *G06F 3/044* | (2006.01) |
| *G06F 3/047* | (2006.01) |
| *H01L 27/32* | (2006.01) |
| *H01L 51/52* | (2006.01) |

(52) U.S. Cl.
CPC .......... *G06F 3/0412* (2013.01); *G06F 3/041* (2013.01); *G06F 3/044* (2013.01); *G06F 3/047* (2013.01); *G06F 3/04166* (2019.05); *H01L 27/323* (2013.01); *H01L 51/5203* (2013.01)

(58) Field of Classification Search
CPC ........ G06F 3/0412; G06F 3/041; G06F 3/044; G06F 3/0416; G06F 3/047; H01L 51/5203; H01L 27/323
See application file for complete search history.

(56) References Cited

U.S. PATENT DOCUMENTS

| | | | |
|---|---|---|---|
| 2012/0218199 A1* | 8/2012 | Kim ...................... | G06F 3/0412 345/173 |
| 2013/0033439 A1 | 2/2013 | Kim et al. | |
| 2015/0109548 A1* | 4/2015 | Kim ...................... | G06F 3/044 349/12 |
| 2016/0026285 A1* | 1/2016 | Qin ........................ | G06F 3/041 345/174 |
| 2016/0062548 A1 | 3/2016 | Kwon | |

(Continued)

FOREIGN PATENT DOCUMENTS

| | | |
|---|---|---|
| CN | 105390093 A | 3/2010 |
| EP | 2492784 A2 | 8/2012 |

(Continued)

*Primary Examiner* — Amit Chatly
(74) *Attorney, Agent, or Firm* — Birch, Stewart, Kolasch & Birch, LLP

(57) ABSTRACT

Disclosed herein is a touch sensor integrated type electroluminescent display device having a plurality of gate lines and data lines crossing over each other; a plurality of pixel electrodes to which data signals are supplied through the plurality of data lines; and a touch electrode configured to overlap the plurality of pixel electrodes, wherein a touch driving signal is supplied to the touch electrode and then a touch position is detected from sensing the touch electrode.

20 Claims, 14 Drawing Sheets

(56) References Cited

U.S. PATENT DOCUMENTS

| | | | |
|---|---|---|---|
| 2016/0132171 A1* | 5/2016 | Hu ........................ | G06F 3/0416 |
| | | | 345/174 |
| 2016/0216800 A1* | 7/2016 | Cho ........................ | G06F 3/044 |
| 2017/0115786 A1* | 4/2017 | Kimura .................... | G06F 3/044 |
| 2017/0115798 A1* | 4/2017 | Ho ........................ | G06F 3/0412 |
| 2017/0269747 A1* | 9/2017 | Hu ........................ | G06F 3/0412 |
| 2018/0232088 A1* | 8/2018 | Gallardo ............... | G06F 3/0412 |

FOREIGN PATENT DOCUMENTS

| | | | |
|---|---|---|---|
| EP | 2866125 | A2 | 4/2015 |
| EP | 2879026 | A1 | 6/2015 |
| EP | 2985682 | A1 | 2/2016 |
| KR | 10-2011-0020049 | A | 3/2011 |
| KR | 10-2014-0062341 | A | 5/2014 |

\* cited by examiner

TOUCH SENSOR INTEGRATED TYPE ELECTROLUMINESCENT DISPLAY DEVICE

CROSS-REFERENCE TO RELATED APPLICATION

This disclosure claims the benefit of priority under 35 U.S.C. § 119(a) to Republic of Korea Patent Application Nos. 10-2016-0142049 filed on Oct. 28, 2016 and 10-2017-0119321 filed on Sep. 18, 2017, the entire contents of each of which is incorporated herein by reference in its entirety.

BACKGROUND OF THE INVENTION

Field of the Invention

This disclosure relates to a touch sensor integrated type electroluminescent display device.

Discussion of the Related Art

A touch sensor is a kind of an input device which may be combined to display devices such as a liquid crystal display (LCD), a field emission display (FED), a plasma display panel (PDP), an electroluminescent display, and an electrophoresis display. Users may input predetermined information to the input device by touching or pressurizing the input device while watching the display devices.

The touch sensor applied to the display device may be implemented as touch sensors such as an add-on type touch screen panel, an on-cell type touch screen panel, and an integrated type (or in-cell type) touch senor.

The add-on type touch screen panel is configured such that the display device and the add-on type touch screen panel are individually manufactured, and then the add-on type touch screen panel is attached to an upper substrate of the display device. There are problems that a thickness of the add-on type touch screen panel increases and visibility of the display device is deteriorated because of a reduction in brightness of the display device due to the thickness increase.

On the other hand, in an instance that the on-cell type touch screen panel is applied to an electroluminescent display device, touch electrodes of the on-cell type touch screen panel are formed on an upper surface of an encapsulator for protecting light emitting elements of the electroluminescent display device. However, it is impossible for a plastic substrate to be used as the encapsulator because a high temperature deposition process is used when touch electrodes of the on-cell type touch screen panel are formed.

For this reason, there is a need for a touch sensor integrated type electroluminescent display device in which touch electrodes is disposed inside the encapsulator.

SUMMARY OF THE INVENTION

An object of this disclosure is to provide a touch sensor integrated type electroluminescence display device with touch electrodes inside the encapsulator.

A touch sensor integrated type electroluminescent display device according to this disclosure includes a plurality of data lines and a plurality of gate lines crossing over each other; a plurality of pixel electrodes to which data signals are supplied through the plurality of data lines; and a touch electrode configured to overlap the plurality of pixel electrodes, wherein a touch driving signal is supplied to the touch electrode and then a touch position is detected from sensing the touch electrode.

The touch driving signal is supplied to the touch electrode through the plurality of data lines.

The touch sensor integrated type electroluminescence display device further comprises a touch line in parallel with at least one of the plurality of data lines, wherein the touch driving signal is supplied to the touch electrode through the touch line.

The touch line is overlapped with at least one of the plurality of data lines.

The touch electrode includes a plurality of touch electrode sections connected to each other.

Each of the plurality of touch electrode sections is disposed to correspond to each of the plurality of pixel electrodes, respectively.

Adjacent touch electrode sections that neighbor each other among the plurality of touch electrode sections are connected by a connection portion.

The touch sensor integrated type electroluminescence display device further comprises a source and touch driver which supplies the data signals to the plurality of data lines and supplies the touch driving signal to the touch electrode.

The source and touch driver selectively supplies one of the data signals and the touch driving signal to the plurality of data lines through a multiplexer.

The source and touch driver supplies the data signals to the plurality of data lines through the multiplexer, and supplies the touch driving signal to the touch electrode through a touch line.

The source and touch driver supplies the data signals to the plurality of data lines during a display operation period of the touch sensor integrated type electroluminescence display device, and supplies the touch driving signal to the plurality of data lines and supplies a load free driving signal having a phase and an amplitude that are the same as the touch driving signal to the plurality of gate lines during a touch operation period of the touch sensor integrated type electroluminescence display device. The display operation period and the touch operation period are obtained by time-dividing one frame period of the touch sensor integrated type electroluminescence display device.

The plurality of data lines and the plurality of gate lines define a plurality of pixel regions that correspond to the plurality of pixel electrodes, and the plurality of touch electrode sections coincide with the plurality of pixel regions, respectively.

The touch sensor integrated type electroluminescence display device further comprises a color filter interposed between the plurality of pixel electrodes and the touch electrode.

Also, a touch sensor integrated type electroluminescent display device according to this disclosure includes a plurality of data lines and a plurality of gate lines crossing over each other to define a plurality of pixel regions; a plurality of pixel electrodes connected to the plurality of data lines, the plurality of pixel electrodes coinciding with the plurality of pixel regions, respectively; and a touch electrode coinciding with the plurality of pixel regions so that a touch position is detected from sensing the touch electrode.

Data signals are supplied to the plurality of data lines and touch driving signals are supplied to the touch electrode simultaneously during one frame period of the touch sensor integrated type electroluminescence display device.

Data signals are supplied to the plurality of data lines during a display operation period, and a touch driving signal is supplied to the touch electrode during a touch operation period, and a load free driving signal having a phase and an amplitude that are the same as the touch driving signal is supplied to the plurality of gate lines and data lines during a touch operation period. The display operation period and the touch operation period are obtained by time-dividing one frame period of the touch sensor integrated type electroluminescence display device.

The touch sensor integrated type electroluminescence display device further comprises a light shielding section apart from the touch electrode section in pixel areas defined by crossings of the plurality of data lines and gate lines.

The light shielding section and the touch electrode section are connected to each other by a connection portion.

The plurality of data lines and gate lines define a plurality of pixel areas corresponding to the plurality of pixel electrodes, each of the plurality of pixel areas includes a light emitting portion and a cell driving portion connected to the data line and the gate line and configured to control light emitting quantity of the light emitting portion. The touch line supplies a touch driving signal to the touch electrode, and supplies a reference voltage to the cell driving portion. The touch driving signal and the reference voltage are supplied by time-dividing one frame period of the touch sensor integrated type electroluminescence display device.

The touch sensor integrated type electroluminescence display device is driven by time-dividing one frame period of the touch sensor integrated type electroluminescence display device into a display operation period, a touch operation period and a compensation operation period. Scan signals are supplied to the plurality of gate lines, and data signals are supplied to the plurality of data lines during the display operation period. The touch driving signal is supplied to the touch line, and a load free driving signal having a phase and an amplitude that are the same as the touch driving signal to the plurality of gate lines and data lines during the touch operation period. Scan signals are supplied to the plurality of gate lines, data signals are supplied to the plurality of data lines, and a sensing signal is supplied to the touch line during the compensation operation period.

According to the touch sensor integrated type electroluminescence display device according to the embodiments of the present invention described above, it is possible for the touch electrode to be prevented from being damaged and also to be easily applied even in a high temperature process, because the touch electrode is disposed inside the encapsulator to be prevented from being exposed to the outside.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
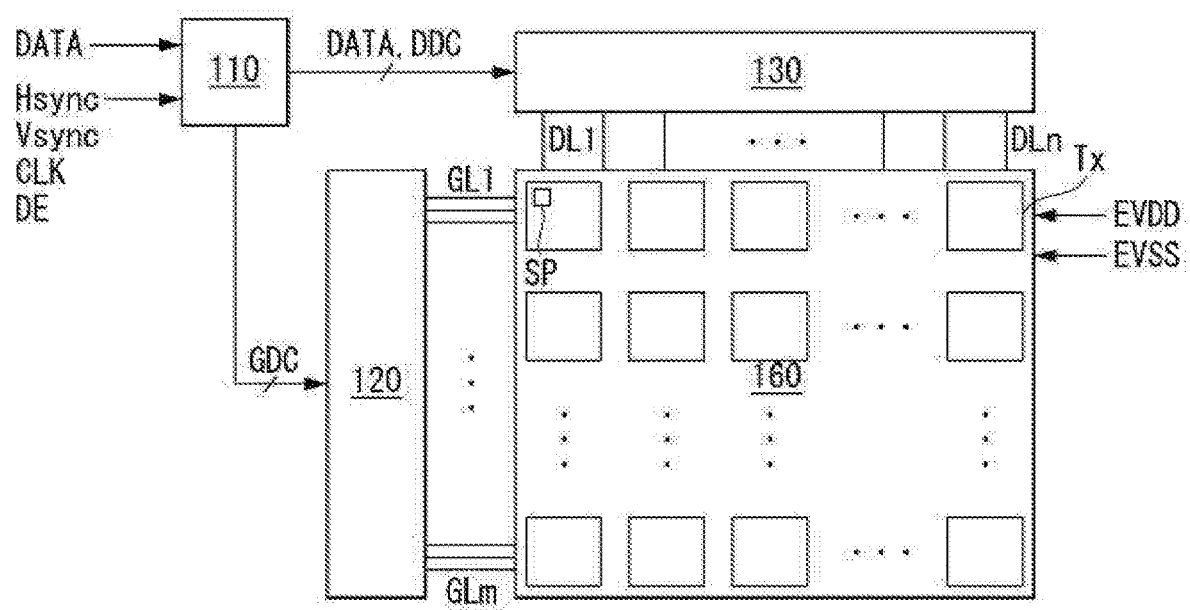
FIG. 1 is a block diagram schematically showing a touch sensor integrated type electroluminescent display device according to an embodiment of this disclosure.

Hereinafter, embodiments of the present invention are described in detail with reference to the accompanying drawings. In the specification, the same reference numerals denote the same elements. In the following description, a detailed description of the known functions and constitutions will be omitted if it is deemed to obscure the embodiments of the present invention. Furthermore, the names of elements used in the following description have been selected by taking into consideration only the ease of writing this specification and may be different from the names of actual parts.

Since positions of the thin film transistors, which refer to a source electrode and a drain electrode of the thin film transistor, may be different depending on PMOS type or NMOS type, drain electrodes of a driving thin film transistor and switching thin film transistors described in the following description may be source electrodes, and vice versa.

A touch sensor integrated type electroluminescent display device according to an embodiment of this disclosure is described below with reference to FIG. 1.

FIG. 1 is a block diagram schematically showing a touch sensor integrated type electroluminescent display device according to an embodiment of this disclosure.

Referring to FIG. 1, the touch sensor integrated type electroluminescent display device includes a timing controller 110, a gate driver 120, a source and touch driver 130, and a display panel 160.

The timing controller 110 controls operation timings of the gate driver 120 and the source and touch driver 130 using timing signals such as a vertical synchronization signal Vsync, a horizontal synchronization signal Hsync, a data enable signal DE, and a main clock signal MCLK, which are received from an external host system. The vertical synchronization signal Vsync and the horizontal synchronization signal Hsync from the external host system may be omitted because the timing controller 110 counts a number of the data enable single DE in one horizontal period to determine a frame period. The control signals generated in the timing controller 110 may include a gate timing signal GDC to control operation timing of the gate driver 120, and a data timing signal DDC and a touch enable signal TES to control operation timing of the source and touch driver 130. In this instance, the timing controller 110 may time-divide one frame period into at least one display operation period and at least one touch operation period by controlling the timing control signals. The display operation period and the touch operation period may be appropriately adjusted in consideration of panel characteristics according to a kind of the display panel 160.

The gate driver 120 generates scan signals while shifting level of a gate driving voltage in response to the gate timing control signal GDC from the timing controller 110. The gate driver 120 supplies scan signals to gate lines GL1 to GLm connected to pixels SP in the display panel 160.

The source and touch driver 130 may selectively supply data signals or touch driving signals to the data lines DL1 to DLn through a multiplexer which is integrated into the source and touch driver 130, or is individually constructed. On the other hand, the source and touch driver 130 supplies the data signals DATA to the data lines DL1 to DLn, and the touch driving signals to touch lines which are individually formed. In this instance, it is unnecessary to time-divide one frame period into the display operation period and the touch operation period because a display operation and a touch operation may be individually performed.

In an instance that one frame period is time-divided into the display operation period and the touch operation period, the source and touch driver 130 samples and latches the data signals DATA to convert them to digital data signals having a parallel data system in response to the data timing control signal DDC from the timing controller 110. The source and touch driver 130 converts the digital data signals into analog data signals corresponding to gamma reference voltages. The source and touch driver 130 supplies the analog data signals to the data lines DL1 to DLn connected to the pixels SP in the display panel 160. The source and touch driver 130 supplies touch driving signals to touch electrodes Tx during the touch operation period, and detects touch spots or touch coordinates by sensing the touch electrodes Tx.

The display panel 160 includes a plurality of touch electrodes Tx as well as a plurality of pixels SP emitting lights having various colors.

The plurality of pixels SP may include a red color, a green color, and a blue color, or include a red color, a green color, a blue color and a white color. In the display panel 160 further including the white color, a light emitting layer of each pixel SP may emit the white color without emitting the red color, the green color and the blue color. In this instance, the light emitted as the white color is converted into the red color, the green color and the blue color by color conversion filters (e.g., red, green and, blue color filters). Additionally, use of other colors is possible.

The pixels SP in the display panel 160 may be driven based on the data signals DATA, the scan signals, a high potential voltage EVDD from first voltage supplying lines, and a low potential voltage from second voltage supplying lines. The display panel 160 displays images through the pixels SP emitting lights corresponding to driving signals from the gate driver 120 and the source and touch driver 130.

A first example and a variation example thereof for one pixel of a touch sensor integrated type electroluminescent display device according to embodiments of this disclosure are described below with reference to FIGS. 2, 3, 6 and 7.

Figure 2:
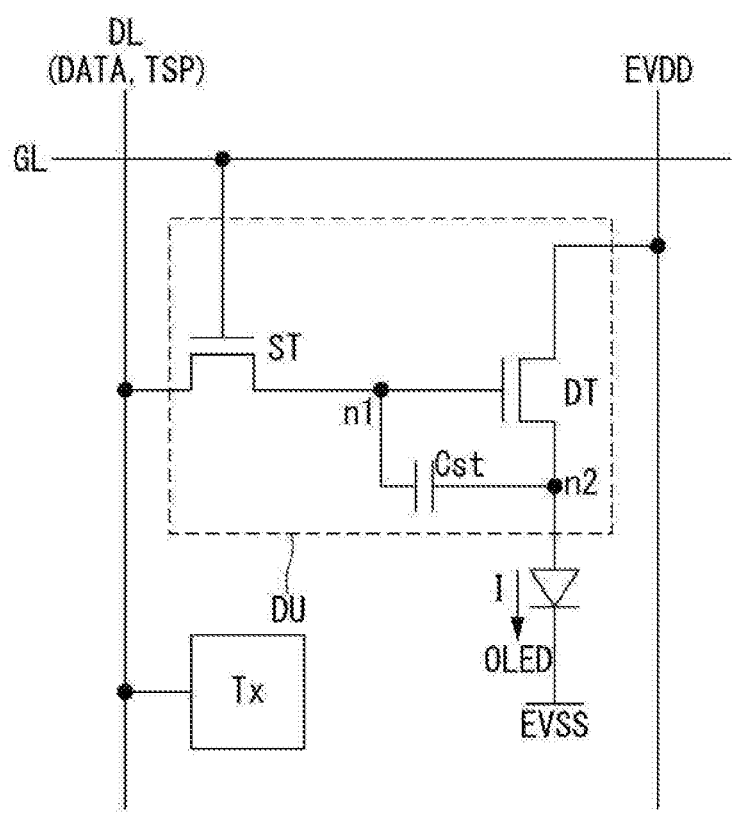
FIG. 2 is an equivalent circuit diagram showing a first example for one pixel of the touch sensor integrated type electroluminescent display device shown in FIG. 1.
Figure 3:
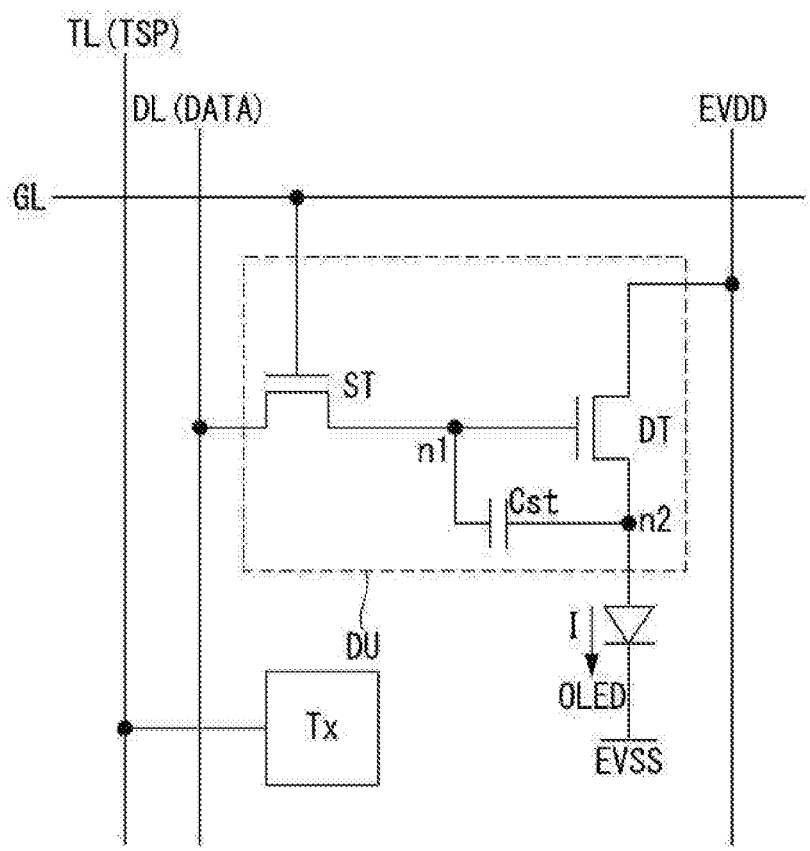
FIG. 3 is an equivalent circuit diagram showing a variation example of the first example for one pixel shown in FIG. 2.
Figure 6:
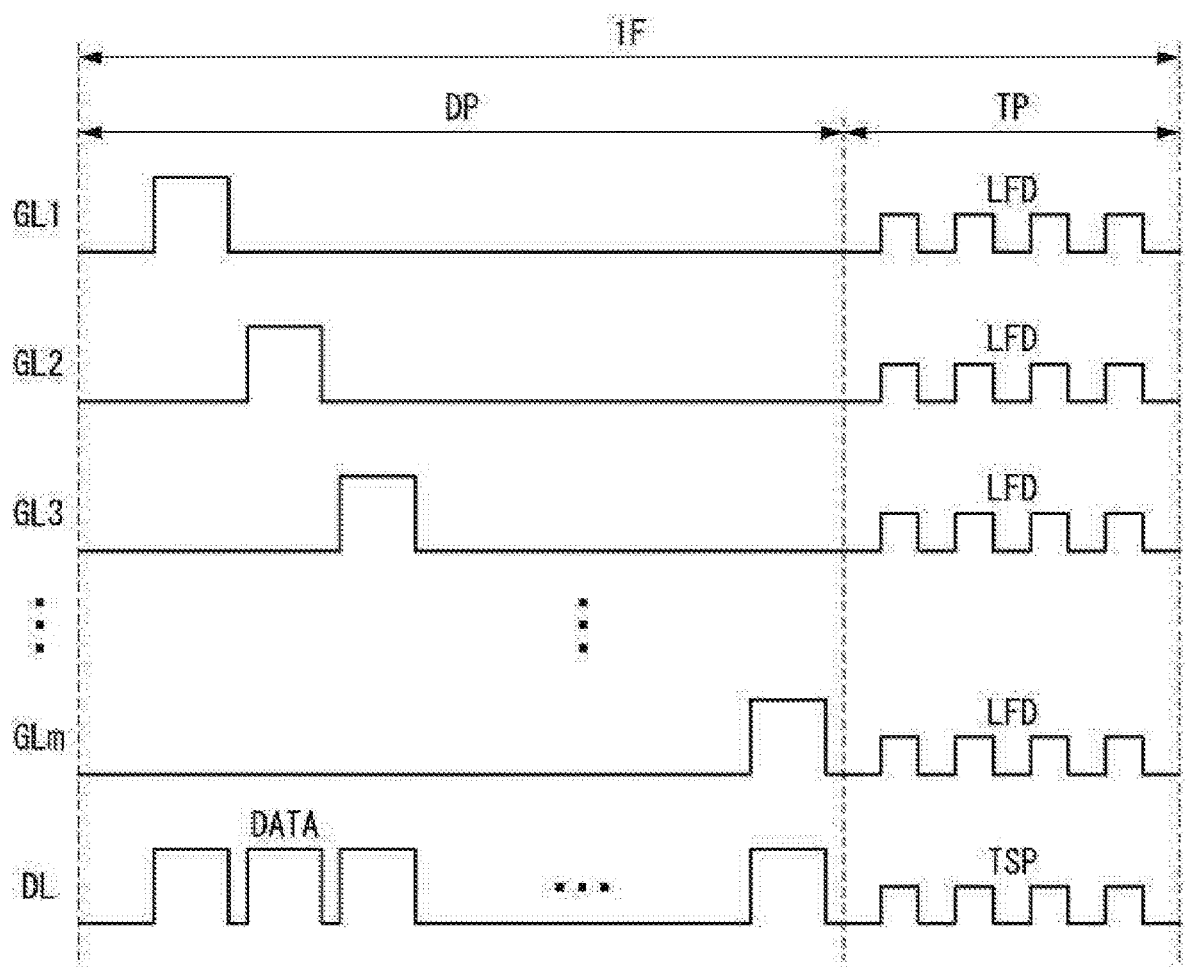
FIG. 6 is a waveform diagram showing signals supplied to the equivalent circuit diagrams shown in FIGS. 2 and 4.
Figure 7:
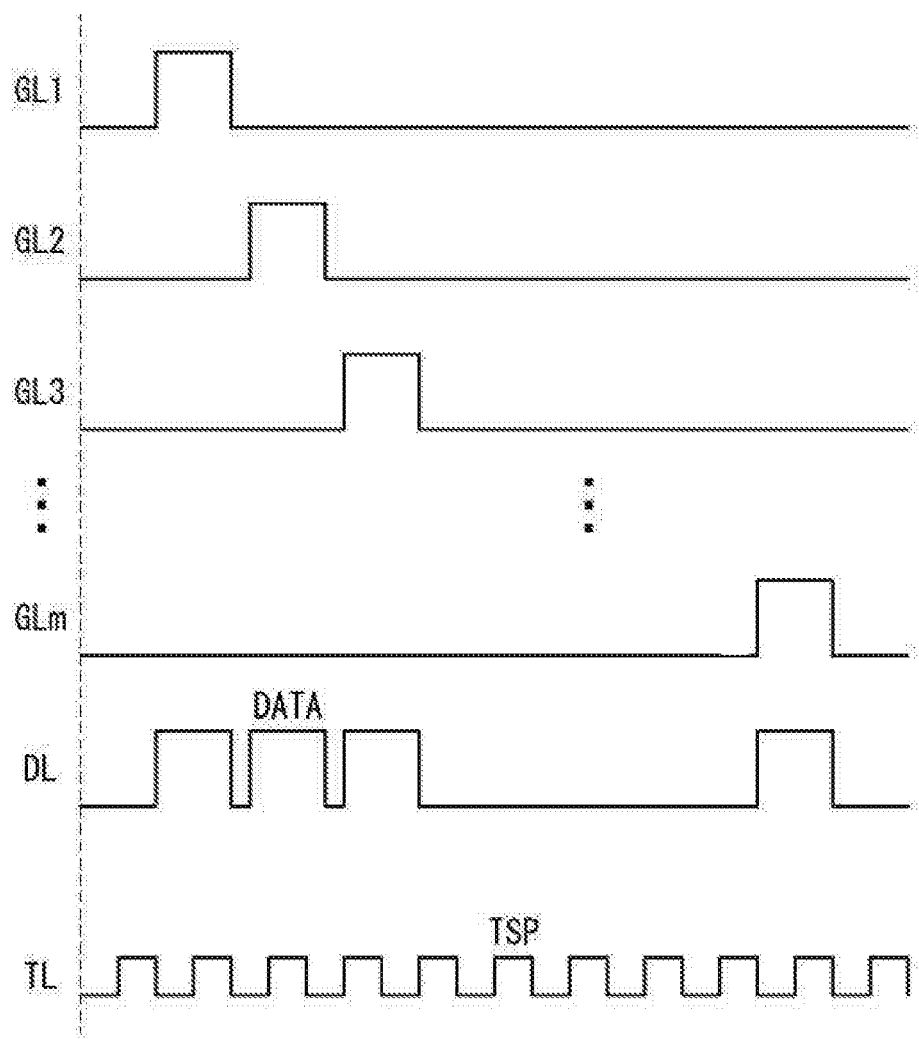
FIG. 7 is a waveform diagram showing signals supplied to the equivalent circuit diagrams shown in FIGS. 3 and 5.

FIG. 2 is an equivalent circuit diagram showing a first example for one pixel of the touch sensor integrated type electroluminescent display device shown in FIG. 1, and FIG. 3 is an equivalent circuit diagram showing a variation example of the first example for one pixel shown in FIG. 2. FIG. 6 is a waveform diagram showing signals supplied to the equivalent circuit diagram shown in FIG. 2, and FIG. 7 is a waveform diagram showing signals supplied to the equivalent circuit diagram shown in FIG. 3.

Referring to FIG. 2, the first example for one pixel of the touch sensor integrated type electroluminescent display device includes a gate line GL, a data line DL, a first voltage supplying line for supplying a high potential voltage EVDD, a second voltage supplying line for supplying a low potential voltage EVSS, a cell driving unit DU, an organic light emitting diode OLED, and a touch electrode Tx. The gate line GL, the data line DL, and the first voltage supplying line are connected to the cell driving unit DU. The organic light emitting diode OLED is connected between the cell driving unit DU and the second voltage supplying line. The touch electrode Tx is connected to the data line DL.

The cell driving unit DU includes a switching thin film transistor ST, a driving thin film transistor DT and a storage capacitor Cst. The switching thin film transistor ST includes a gate electrode connected to the gate line GL, a source electrode connected to the data line DL, and a drain electrode connected to a first node n1. The driving thin film transistor DT includes a gate electrode connected to the first node n1, a source electrode connected to the first voltage supplying line, and a drain electrode connected to a second node n2. The storage capacitor Cst includes a first electrode connected to the first node n1 and a second electrode connected to the second node n2. To the first node n1, the drain electrode of the switching thin film transistor ST, the gate electrode of the driving thin film transistor DT, and the first electrode of the storage capacitor Cst. To the second node n2, the drain electrode of the driving thin film transistor DT, the second electrode of the storage capacitor Cst, and an anode electrode of the organic light emitting diode OLED.

The organic light emitting diode OLED is connected between the second node n2 and the second voltage supplying line.

In the pixel construction of the first example, it is possible to time-divide one frame period 1F into a display operation period DP and a touch operation period TP as shown in FIG. 6, because the data line DL is connected to the switching thin film transistor ST of the cell driving unit DU and the touch electrode Tx.

During the display operation period DP, the switching thin film transistor ST supplies a data signal from the data line DL to the storage capacitor Cst and the gate electrode of the driving thin film transistor DT when the switching thin film transistor ST is turned-on by a scan signal supplied to the gate line GL. In response to the data signal supplied to the gate electrode of the driving thin film transistor DT, the driving thin film transistor DT controls current I supplied from the first voltage supplying line to the organic light emitting diode OLED, thereby adjusting a light emitting quantity of the organic light emitting diode OLED. Although the switching thin film transistor ST is turned-off, the driving thin film transistor DT supplies the constant current I to the organic light emitting diode OLED to maintain the light emitting quantity until data signals corresponding to a next frame is supplied to the second node n2.

During the touch operation period TP, a touch driving signal TSP is supplied to the data line DL as shown in FIG. 6, and a load free driving signal LFD is supplied to the gate lines GL1 to GLm. The load free driving signal LFD has a phase and an amplitude the same as those of the touch driving signal TSP. Also, the load free driving signal LFD may be supplied to at least one of the sensing lines SL, the reference lines which are not sensed, the first voltage supplying line, and the second voltage supplying line. The load free driving signal LFD may be a signal having the phase and the amplitude the same as the touch driving signal TSP, but it is not necessarily limited thereto. That is, if the signal is for minimizing the influence of the parasitic capacitance between the touch electrode and other electrodes in the display panel 160, the load-free drive signal LFD may be set to a signal of a proper type.

It is possible to measure changes of capacitance of the touch electrode Tx before and after touch events to obtain touch spots or touch coordinates when the touch electrode is sensed after the touch driving signal TSP is supplied to the touch electrode Tx through the data line DL.

Referring to FIG. 3, a variation example of the first example for one pixel of the touch sensor integrated type electroluminescent display device includes a gate line GL, a data line DL, a first voltage supplying line for supplying a high potential voltage EVDD, a second voltage supplying line for supplying a low potential voltage EVSS, a touch line TL for supplying a touch driving signal TSP, a cell driving unit DU, an organic light emitting diode OLED, and a touch electrode Tx. The gate line GL, the data line DL, and the first voltage supplying line are connected to the cell driving unit DU. The organic light emitting diode OLED is connected between the cell driving unit DU and the second voltage supplying line. The touch electrode Tx is connected to the touch line TL which is in parallel with the data line DL.

The variation example shown in FIG. 3 is substantially same to the first example shown in FIG. 2 excepting that an individual touch line TL is disposed to supply the touch driving signal to the touch electrode Tx, and there is no need to time-divide one frame period into the display operation period and the touch operation period. Accordingly, further explanations are omitted in order to avoid redundant description.

A second example and a variation example thereof for one pixel of a touch sensor integrated type electroluminescent display device according to embodiments of this disclosure is described below with reference to FIGS. 4, 5, 6 and 7.

Figure 4:
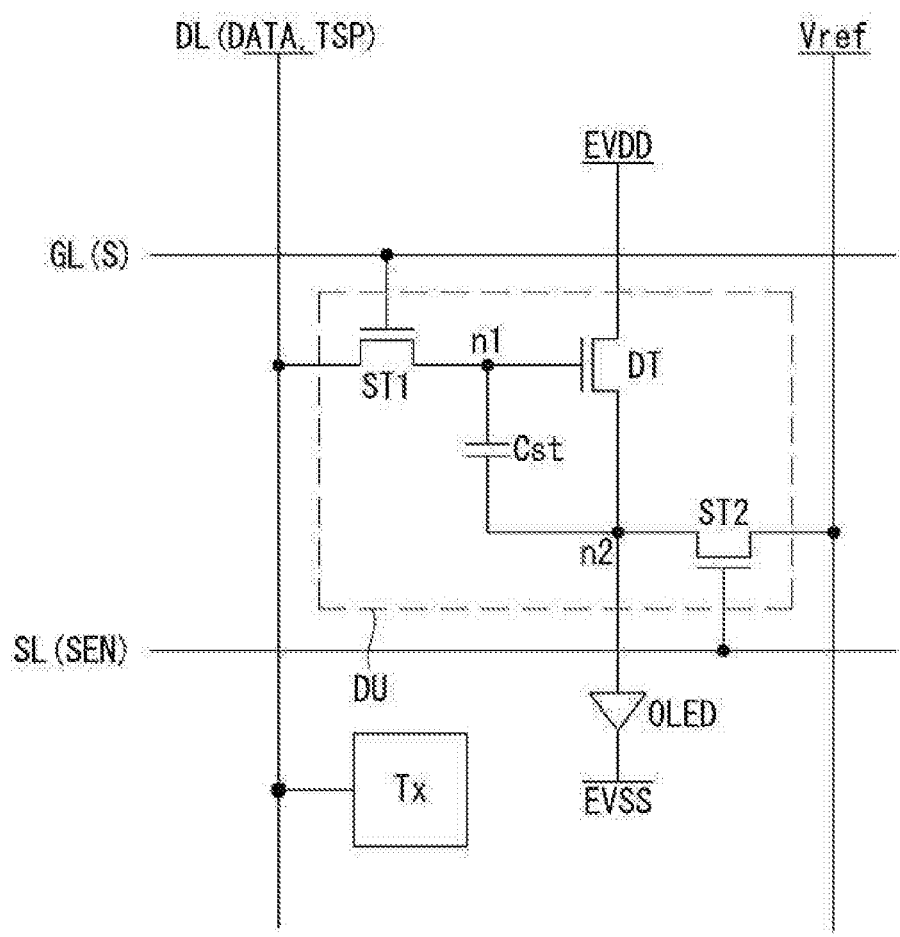
FIG. 4 is an equivalent circuit diagram showing a second example for one pixel of the touch sensor integrated type electroluminescent display shown in FIG. 1.
Figure 5:
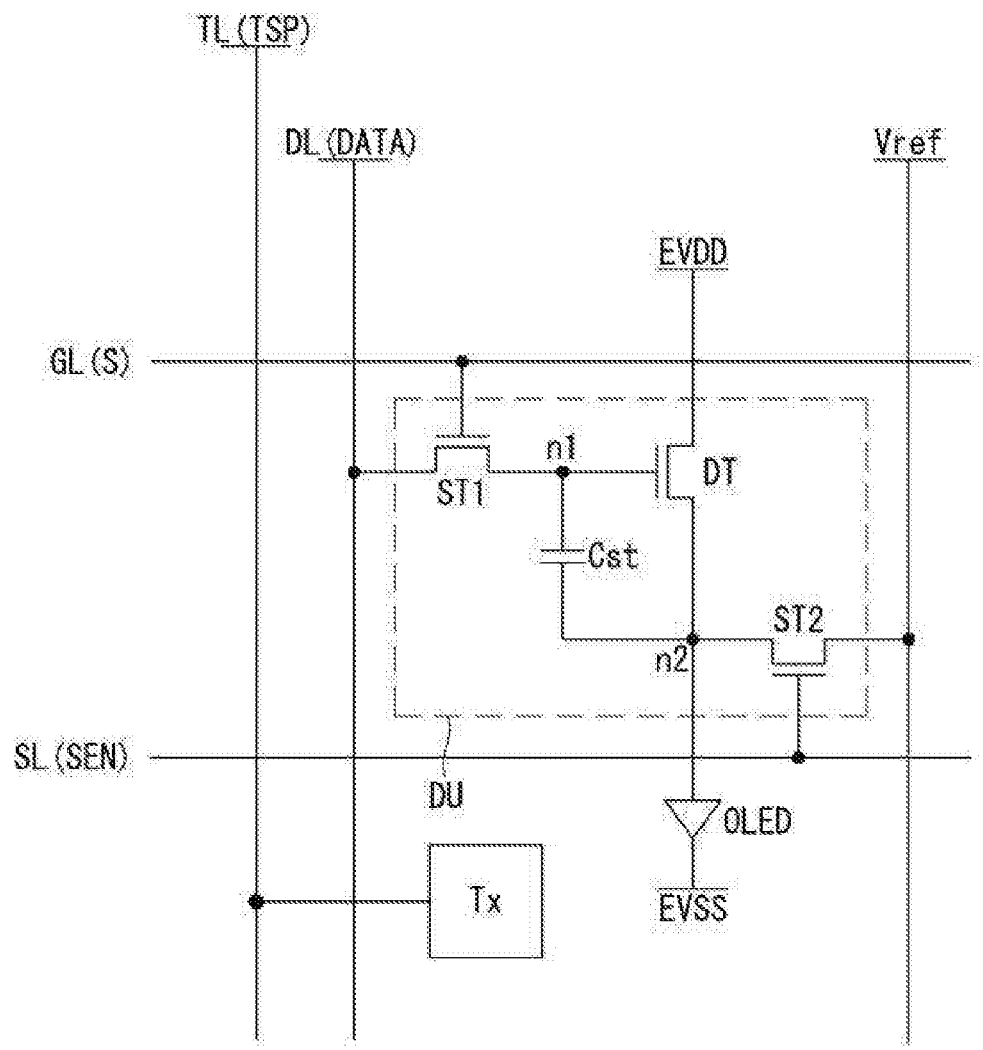
FIG. 5 is an equivalent circuit diagram showing a variation example of the second example for one pixel shown in FIG. 2.

FIG. 4 is an equivalent circuit diagram showing a second example for one pixel of the touch sensor integrated type electroluminescent display device shown in FIG. 1, and FIG. 5 is an equivalent circuit diagram showing a variation example of the second example for one pixel shown in FIG. 4. FIG. 6 is a waveform diagram showing signals supplied to the equivalent circuit diagram shown in FIG. 4, and FIG. 7 is a waveform diagram showing signals supplied to the equivalent circuit diagram shown in FIG. 5.

Referring to FIG. 4, the second example for one pixel of the touch sensor integrated type electroluminescent display device includes a gate line GL, a sensing line SL, a data line DL, a first voltage supplying line for supplying a high potential voltage EVDD, a second voltage supplying line for supplying a low potential voltage EVSS, a reference voltage supplying line for supplying a reference voltage Vref, a cell driving unit DU, an organic light emitting diode OLED, and a touch electrode Tx. The gate line GL, the data line DL, and the first voltage supplying line are connected to the cell driving unit DU. The organic light emitting diode OLED is connected between the cell driving unit DU and the second voltage supplying line. The touch electrode Tx is connected to the data line DL.

The cell driving unit DU includes a first switching thin film transistor ST1, a second switching thin film transistor ST2, a driving thin film transistor DT and a storage capacitor Cst.

The driving thin film transistor DT controls driving current flowing through the organic light emitting diode OLED according to a voltage difference between a first node n1 and a second node n2. The driving thin film transistor DT includes a gate electrode connected to the first node n1, a drain electrode connected to the first voltage supplying line, and a source electrode connected to the second voltage supplying line.

The storage capacitor Cst connected between the first node n1 and the second node n2.

The first switching thin film transistor ST1 supplies the data voltage DATA from the data line DL to the first node n1 in response to the scan signal S from the gate line GL. The first switching thin film transistor ST1 includes a gate electrode connected to the gate line GL, a drain electrode connected to the data line DL, and a source electrode connected to the first node n1.

The second switching thin film transistor ST2 supplies the reference voltage Vref from the reference voltage supplying line to the second node n2 in response to the sensing signal SEN from the sensing line SL. The second switching thin film transistor ST2 includes a gate electrode connected to the sensing line SL, a drain electrode connected to the reference voltage supplying line, and a source electrode connected to the second node n2.

The organic light emitting diode OLED is connected between the second node n2 and the second voltage supplying line.

In the pixel construction of the second example, it is possible to time-divide one frame period 1F into a display operation period DP and a touch operation period TP as shown in FIG. 6, because the data line DL is connected to the first switching thin film transistor ST1 of the cell driving unit DU and the touch electrode Tx.

During the display operation period DP, the first switching thin film transistor ST1 supplies the data signal DATA from the data line DL to the storage capacitor Cst and the gate electrode of the driving thin film transistor DT when the first switching thin film transistor ST1 is turned-on by the scan signal S supplied to the gate line GL. In response to the data signal DATA supplied to the gate electrode of the driving thin film transistor DT, the driving thin film transistor DT controls current I supplied from the first voltage supplying line to the organic light emitting diode OLED, thereby adjusting a light emitting quantity of the organic light emitting diode OLED. Although the first switching thin film transistor ST1 is turned-off, the driving thin film transistor DT supplies the constant current I to the organic light emitting diode OLED to maintain the light emitting quantity until data signals corresponding to a next frame is supplied to the second node n2.

During the touch operation period TP, a touch driving signal TSP is supplied to the data line DL as shown in FIG. 6, and a load free driving signal LFD is supplied to the gate lines GL1 to GLm. The load free driving signal LFD has a phase and an amplitude the same as those of the touch driving signal TSP. It is possible to measure changes of capacitance of the touch electrode Tx before and after touch events to obtain touch spots or touch coordinates when the touch electrode is sensed after the touch driving signal TSP is supplied to the touch electrode Tx through the data line DL.

Referring to FIG. 5, a variation example of the second example for one pixel of the touch sensor integrated type electroluminescent display device includes a gate line GL, a sensing line SL, a data line DL, a first voltage supplying line for supplying a high potential voltage EVDD, a second voltage supplying line for supplying a low potential voltage EVSS, a reference voltage supplying line for supplying a reference voltage Vref, a touch line TL for supplying a touch driving signal TSP, a cell driving unit DU, an organic light emitting diode OLED, and a touch electrode Tx. The gate line GL, the sensing line SL, the data line DL, the reference line, and the first voltage supplying line are connected to the cell driving unit DU. The organic light emitting diode OLED is connected between the cell driving unit DU and the second voltage supplying line. The touch electrode Tx is connected to the touch line TL which is in parallel with the data line DL. The touch line TL may be overlapped with the data line DL.

The variation example shown in FIG. 5 is substantially same to the second example shown in FIG. 4 excepting that an individual touch line TL is disposed to supply the touch driving signal TSP to the touch electrode Tx, and there is no need to time-divide one frame period into the display operation period and the touch operation period. Accordingly, further explanations are omitted in order to avoid redundant description.

A third example for one pixel of a touch sensor integrated type electroluminescent display device according to embodiments of this disclosure is described below with reference to FIGS. 8 and 9.

Figure 8:
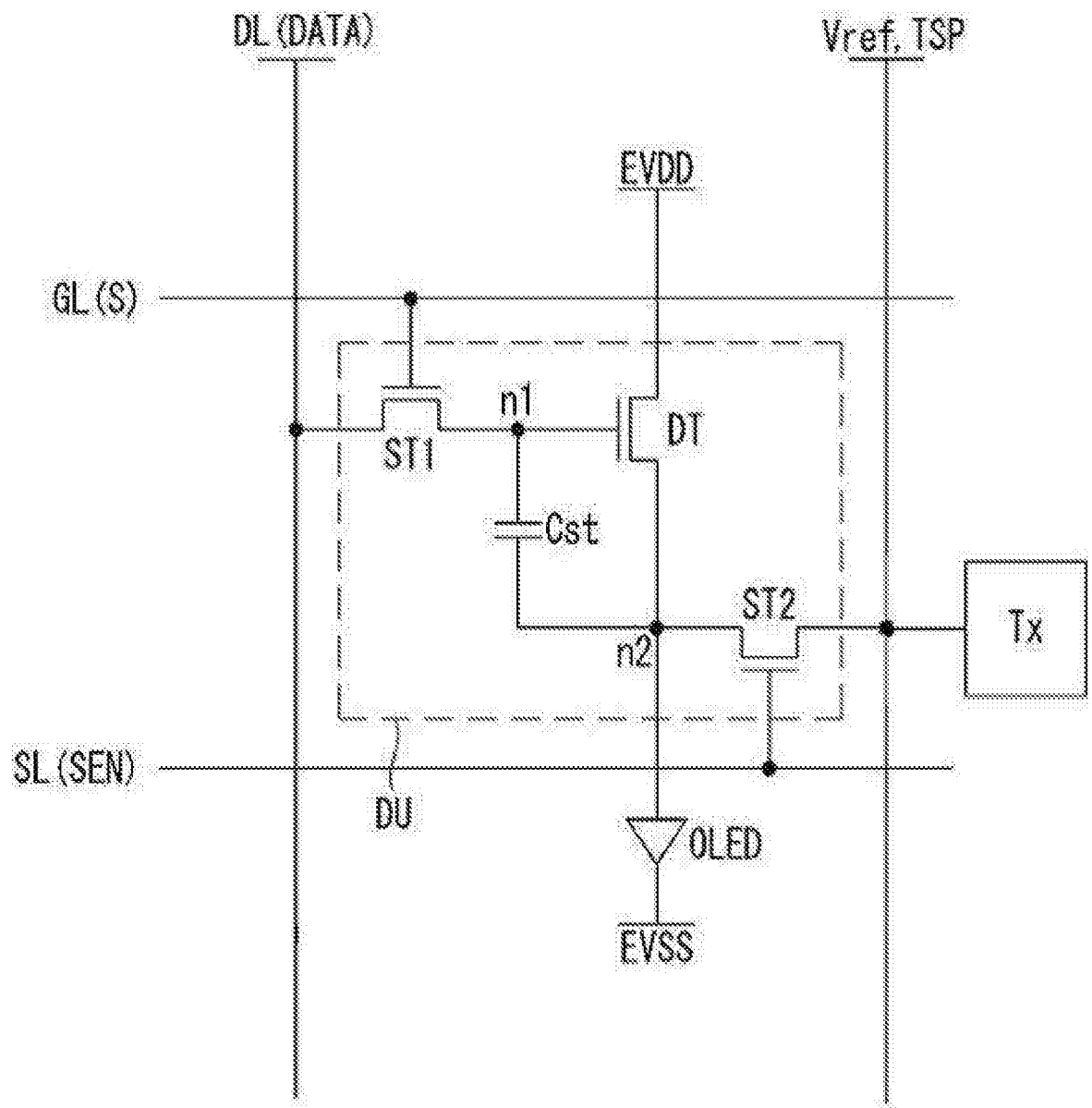
FIG. 8 is an equivalent circuit diagram showing a third example for one pixel of the touch sensor integrated type electroluminescent display device shown in FIG. 1.

FIG. 8 is an equivalent circuit diagram showing a third example for one pixel of the touch sensor integrated type electroluminescent display device shown in FIG. 1. FIG. 9 is a waveform diagram showing signals supplied to the equivalent circuit diagram shown in FIG. 8.

Referring to FIG. 8, a third example for one pixel of the touch sensor integrated type electroluminescent display device includes a gate line GL, a sensing line SL, a data line DL, a first voltage supplying line for supplying a high potential voltage EVDD, a second voltage supplying line for supplying a low potential voltage EVSS, a reference voltage supplying line for supplying a reference voltage Vref or a touch driving signal TSP, a cell driving unit DU, an organic light emitting diode OLED, and a touch electrode Tx. The gate line GL, the sensing line SL, the data line DL, the reference line, and the first voltage supplying line are connected to the cell driving unit DU. The organic light emitting diode OLED is connected between the cell driving unit DU and the second voltage supplying line. The touch electrode Tx is connected to the touch line TL which is in parallel with the data line DL. The reference line may supply the reference voltage Vref to the cell driving unit DU or supply the touch driving signal TSP to the touch electrode Tx. Also the reference line may receive a sensing data from the touch electrode Tx.

The cell driving unit DU includes first and second switching thin film transistors ST1 and ST2, a driving thin film transistor DT, and a storage capacitor Cst.

The driving thin film transistor DT controls a driving current flowing into the organic light emitting diode OLED according to a voltage difference between a first node n1 and a second node n2. The driving thin film transistor DT includes a gate electrode connected to the first node n1, a drain electrode connected to the first voltage supplying line, and a source electrode connected to the second node n2. The storage capacitor Cst is connected between the first node n1 and the second node n2.

The first switching thin film transistor ST1 switches the current flowing between the data line DL and the first node n1 in response to the scan signal supplied to the gate line GL, thereby supplying the data voltage from the data line DL to the first node n1. The first switching thin film transistor ST1 includes a gate electrode connected to the gate line GL, a drain electrode connected to the data line DL, and a source electrode connected to the first node n1.

The second switching thin film transistor ST2 senses a voltage level at the second node n2 in response to the sensing signal SEN supplied to the sensing line SL, thereby supplying the sensed voltage to the reference line. The second switching thin film transistor ST2 includes a gate electrode connected to the sensing line SL, a drain electrode connected to the reference line, and a source electrode connected to the second node n2.

The organic light emitting diode OLED is connected between the first node n1 and the second node n2 of the cell driving unit DU. The organic light emitting diode OLED emits light since the high potential voltage EVDD from the first voltage supplying line is supplied to the organic light emitting diode OLED when the driving thin film transistor DT is turned-on.

In the pixel construction of the third example, the reference line is connected to both the second switching thin film transistor ST2 and the touch electrode Tx. Accordingly, it is possible for the touch sensor integrated type electroluminescent display device having the pixel construction of the third example to be driven in a display operation period DP, a touch operation period TP and a compensation operation period CD which are obtained by time-dividing one frame period 1F.

Figure 9:
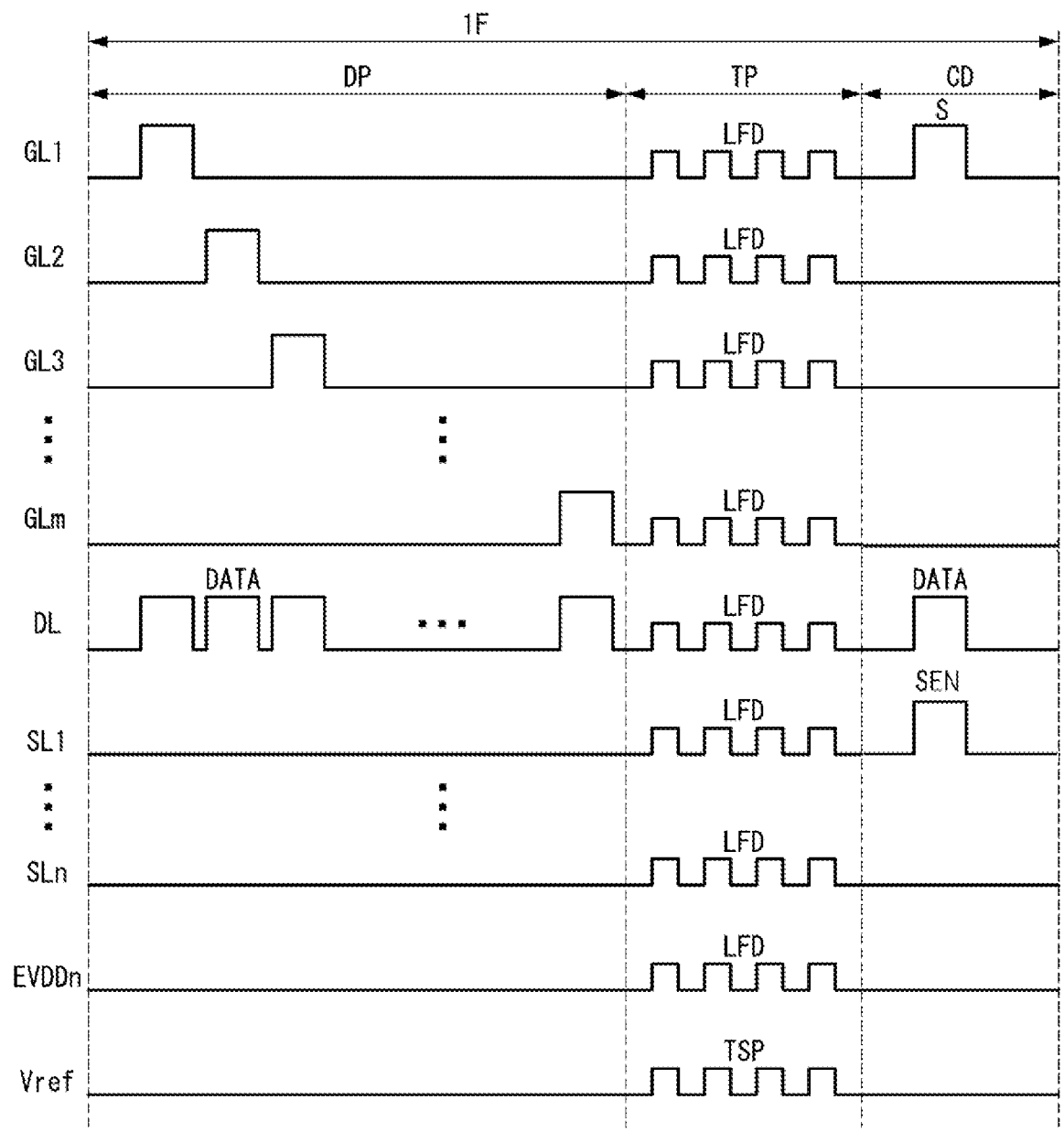
FIG. 9 is a waveform diagram showing signals supplied to the equivalent circuit diagram shown in FIG. 8.

Referring to FIGS. 8 and 9, during the display operation period DP, a scan signal S is supplied to the gate line GL, and a sensing signal SEN is supplied to the sensing line SL. Also, the high potential voltage EVDD is supplied to the first voltage supplying line, and the reference voltage Vref is supplied to the reference line.

When the scan signal S is supplied to the gate line GL, the first switching thin film transistor ST1 is turned-on, and then the data signal DATA supplied to the data line DL is supplied to the first node n1. In an initial display operation period, a sensing signal SEN is supplied to the cell driving unit DU via the sensing line SL so that the reference voltage Vref may be supplied to the second node n2. The second switching thin film transistor ST2 supplies the reference voltage Vref to the second node n2.

The gate-source voltage Vgs of the driving thin film transistor DT is determined according to the difference between the voltage of the data signal supplied to the first node n1 by the turn-on of the first switching thin film transistor ST1 and the reference voltage Vref (an instance of an initial driving) or the difference between the voltage of the data signal supplied to the first node n1 and the voltage supplied to the source electrode of the driving thin film transistor DT (an instance of driving after the initial driving). The driving thin film transistor DT is turned-on when the gate-source voltage Vgs of the driving thin film transistor DT is larger than the threshold value thereof.

The storage capacitor Cst is charged until the potential between the first node n1 and the second node n2 becomes equal.

Since the driving thin film transistor DT is turned-on when the data signal supplied to the gate electrode of the driving thin film transistor DT is larger than the threshold voltage of the driving thin film transistor DT, it is possible to control the current quantity flowing into the organic light emitting diode OLED from the first voltage supplying line according to the data signal. Accordingly, the organic light emitting diode OLED can control a light emitting quantity according to the current supplied from the driving thin film transistor DT.

When the gate signal S is not supplied to the gate line GL, the first thin film transistor ST1 is turned-off. The data signal is not supplied to the first node n1 but the driving thin film transistor DT receives a constant current from the storage capacitor Cst until a data signal belonging to a next frame is supplied to the first node n1 since the storage capacitor Cst is charged. Accordingly, the organic light emitting diode OLED maintains the light-emitting state without supplying the data signal to the first node n1.

In the touch operation period TP as shown in FIG. 9, the touch driving signal TSP is supplied to the reference line, and a load free driving signal LFD having a phase and an amplitude that are the same as the touch driving signal TSP is supplied to the gate line GL, the data line DL, the sensing line SL, reference lines (which are sensed), the first voltage supplying line EVDD and the second voltage supplying line EVSS. The load-free driving signal LFD may be a signal having the phase and the amplitude the same as the touch driving signal TSP, but it is not necessarily limited thereto. That is, if the signal is for minimizing the influence of the parasitic capacitance between the touch electrode and other electrodes in the display panel 160, the load-free drive signal LFD may be set to a signal of a proper type or a desired type.

It is possible to decide whether to touch and obtain touch coordinates since a variation of capacitance before and after a touch event is measured by sensing the touch electrode Tx after the touch driving signal TSP is supplied to the touch electrode Tx via the reference line Vref. Thus, when the load free driving signal LFD is supplied to the gate line GL, the data line DL, the sensing line SL, and the first voltage supplying line during the touch operation period TP, it is possible to minimize the parasitic capacitance between the touch electrode Tx and the various lines such as the gate line GL, the data line DL, the sensing line SL, and the first voltage supplying line connected to the cell driving unit DU. Therefore, it is possible to prevent or reduce noises from being generated during the touch operation period TP.

In the compensation operation period CD, the scan signal S is supplied to the gate line GL, the data signal DATA is supplied to the data line DL, and the sensing signal SEN is supplied to the sensing line SL.

When the scan signal S is supplied to the gate line GL, the first switching thin film transistor ST1 is turned-on, thereby supplying the data signal to the first node n1. When the sensing signal SEN is supplied to the sensing line SL, the switching thin film transistor ST2 is turned-on, thereby sensing the source voltage of the driving thin film transistor DT connected to the second node n2. Accordingly, the sensed source voltage is supplied to the reference line Vref.

During the compensation operation period CD, it is possible to sense the level of the source voltage of the driving thin film transistor DT and compensate the level of the source voltage of the driving thin film transistor DT using a compensation method.

A relationship between a touch electrode and pixel electrodes of a touch sensor integrated type electroluminescent display device according to embodiments of this disclosure is described below with reference to FIG. 10.

Figure 10:
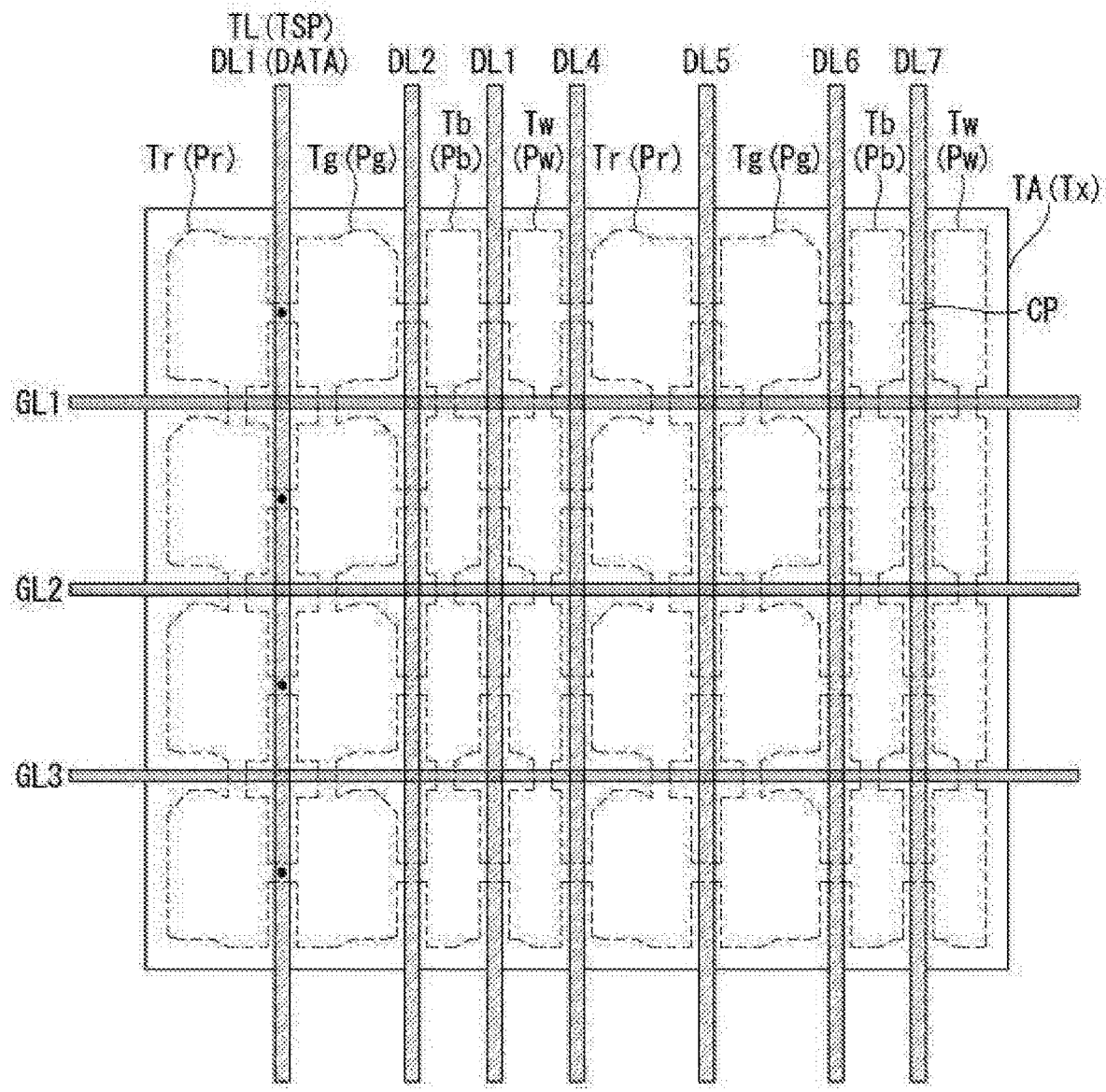
FIG. 10 is a plan view showing a region corresponding to one touch electrode shown in FIG. 1.

FIG. 10 is a plan view showing a region corresponding to one touch electrode shown in FIG. 1.

Referring to FIG. 10, a plurality of pixel regions are defined from crossings of a plurality of data lines DL1 to DL7 and a plurality of gate lines GL1 to GL3. There is one pixel electrode in each of pixel regions. The pixel electrode constitutes an anode electrode. A unit touch electrode Tx, which is a touch electrode Tx for detecting one touch position, consists of a plurality of touch electrode pieces (or sections) which are connected to each other. Each of touch electrode pieces is overlapped with each of the pixel electrodes. For convenience, the unit touch electrode Tx and a unit touch region are disposed at a same position as shown in FIG. 8. When the number of touch electrode pieces in the touch sensor integrated type electroluminescent display device according to embodiments of this disclosure is increased, the touch accuracy is lowered because the size of the unit touch region is increased. On the other hand, when the number of touch electrode pieces is decreased, the touch accuracy is increased because the size of the unit touch area is decreased. According to this disclosure, the size of the unit touch electrode can be easily designed according to the need for the touch precision. Therefore, it is possible to easily design the size of the unit touch electrode according to a need for touch precision.

As shown in FIG. 10, when a unit pixel electrode for realizing the full color is composed of pixel electrodes Pr, Pg, Pb and Pw corresponding to red color, green color, blue color B and white color W, respectively, each of touch electrode pieces Tr, Tg, Tb and Tw may be formed to have a size substantially equal to that of each the pixel electrodes Pr, Pg, Pb and Pw. However, the sizes of the touch electrode pieces and the pixel electrodes are not necessarily the same.

The touch electrode pieces in one touch region TA are connected to each other by connection portions CP. Each of the connection portions CP has a crossing portion crossing over the data line DL1, DL2, DL3, . . . , or DL7, or the gate lines GL1, GL2, or GL3. The connection portions CP has a narrower width than the touch electrode piece Pr, Pg, Pb or Pw to reduce a parasitic capacitance between the data line DL1, DL2, DL3, . . . , or DL7 and the connection portion CP. The crossing portion may have a narrower width than the connection portion CP, thereby further reducing the parasitic capacitance between the data line DL1, DL2, DL3, . . . , or DL7, or gate lines GL1, GL2, GL3 and the connection portion CP.

A first data line (e.g. DL1) of the data lines DL1 to DL7 may connect all of the touch electrode pieces in the one touch region TA disposed in a first column and a first row through at least one connection portion CP (e.g. six connection portions CP in FIG. 8). Similarly, a second data line DL2 may connects all of touch pieces in another region disposed in the first column and a second row. In this manner, when the data lines and the touch electrode pieces in each touch area are connected, a display driving operation and a touch driving operation can be time-divisionally driven. Accordingly, during a touch operation period of one frame period, the touch electrode Tx is supplied with the touch driving signal TSP through the data line DL1, DL2, . . . , and DL7, and then a sensed data obtained by sensing the touch electrode Tx is supplied to the source and touch driver 130 through the data line DL1.

When the touch line TL is separately provided and connected to the touch electrode Tx, the time division driving is unnecessary. In this instance, the touch electrode Tx is supplied with the touch driving signal TSP through the touch line TL, and then a sensed data obtained by sensing the touch electrode Tx is supplied to the source and touch driver 130 through the touch line TL.

Next, an example of the pixel structure of the touch sensor integrated type display device according to the embodiments of this disclosure will be described in more detail with reference to FIGS. 11 to 12B.

Figure 11:
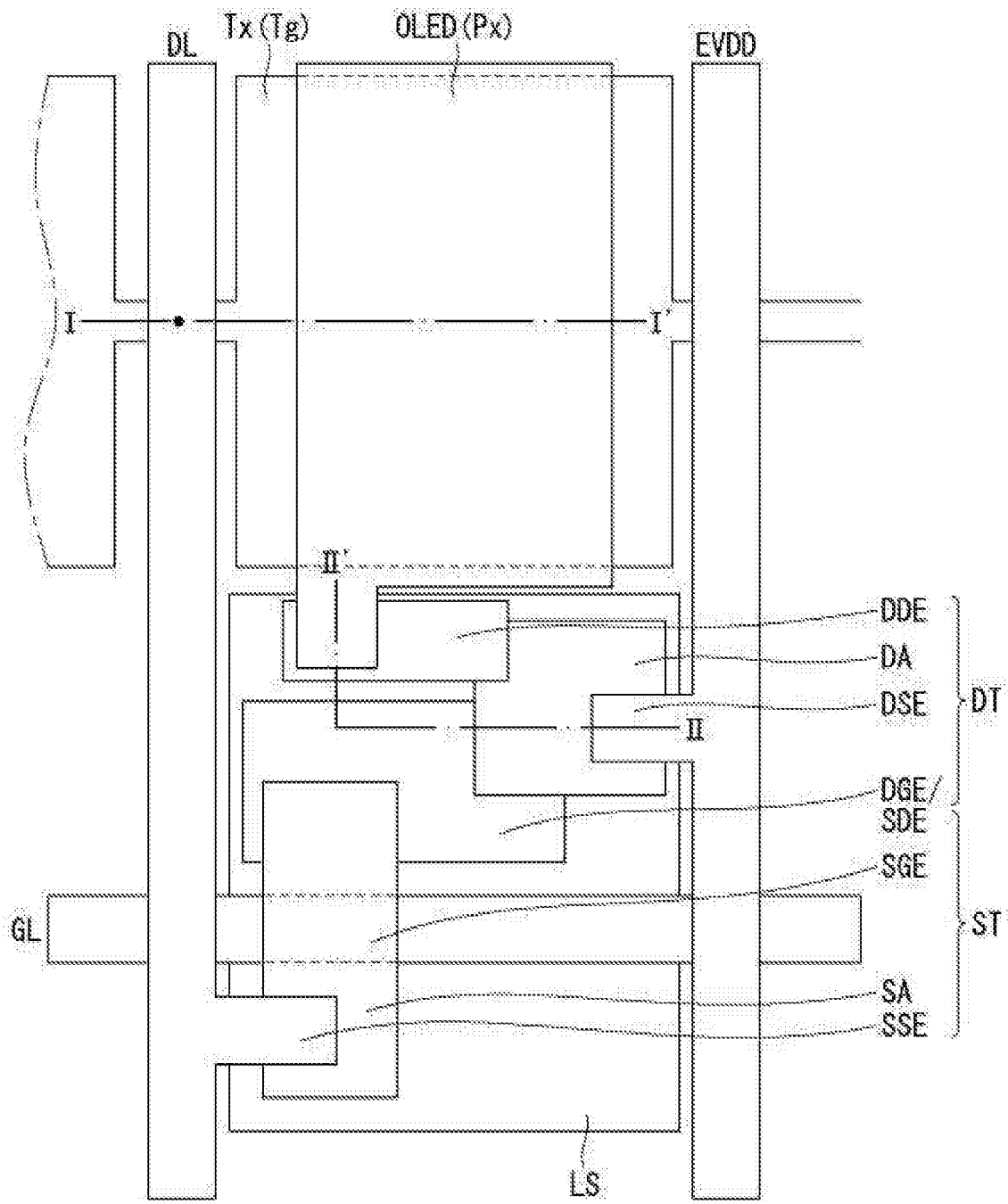
FIG. 11 is a plan view schematically showing one example for one pixel of the touch sensor integrated type electroluminescent display device shown in FIG. 10.
Figure 12A:
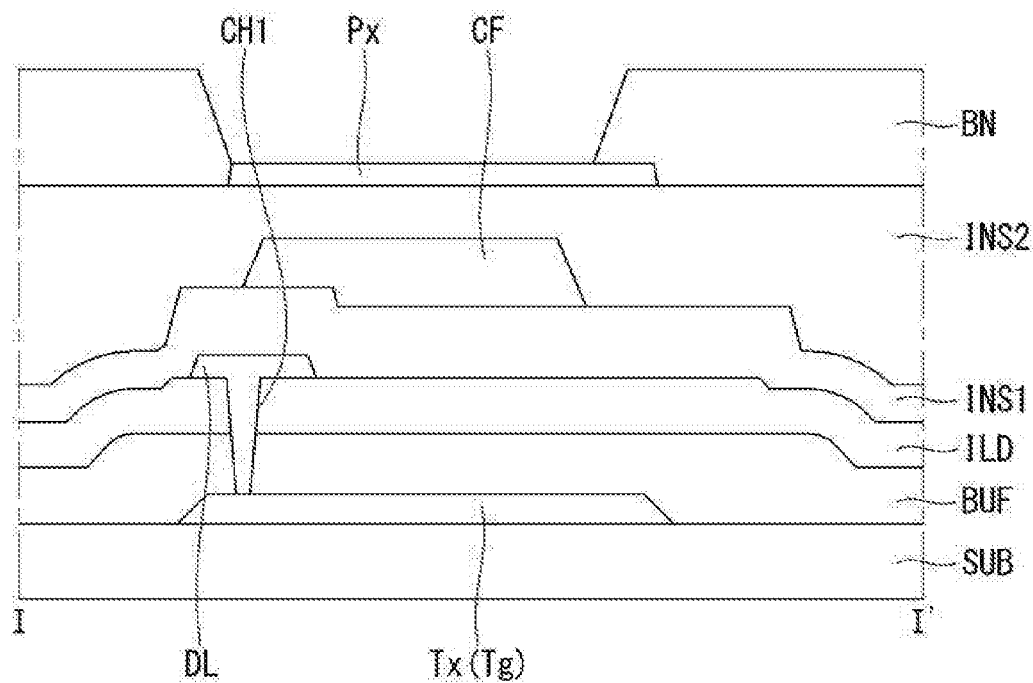
FIG. 12A is a cross-sectional view taken along line I-I' of FIG. 11.

FIG. 11 is a plan view schematically showing one example for one pixel of the touch sensor integrated type electroluminescent display device shown in FIG. 10. FIG. 12A is a cross-sectional view taken along line I-I' of FIG. 11, and FIG. 12B a cross-sectional view taken along line II-II' of FIG. 11.

Referring to FIG. 11, the touch sensor integrated type display device according to the embodiments of this disclosure includes a plurality of pixel regions. There are a gate line GL, a data line DL, a first voltage supplying line for supplying a high potential voltage EVDD, a second voltage supplying line for supplying a low potential voltage EVSS, a cell driving unit, a pixel electrode Px of an organic light emitting diode OLED, and a touch electrode piece Tg of a touch electrode Tx in each pixel region.

The cell driving unit includes a switching thin film transistor ST, a driving thin film transistor DT and a storage capacitor.

The switching thin film transistor ST includes a gate electrode SGE which is a portion of the gate line GL, a source electrode SSE extended from the data line DL, and a drain electrode SDE separated from the source electrode SSE.

The driving thin film transistor DT includes a source electrode DSE extended from the first voltage supplying line, a gate electrode DGE which is also the drain electrode SDE of the switching thin film transistor ST, and a drain electrode DDE connected to the pixel electrode Px.

Figure 12B:
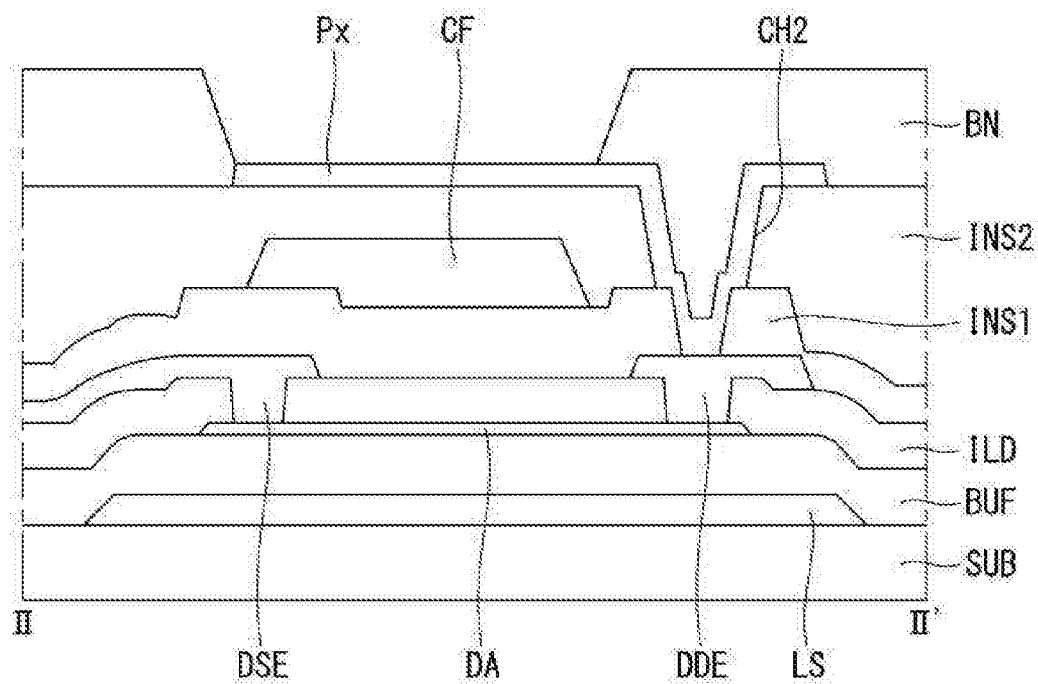
FIG. 12B a cross-sectional view taken along line II-II' of FIG. 11.

Referring to FIGS. 12A and 12B, there are a light shielding pattern LS and a touch electrode piece Tg on a substrate SUB. The touch electrode piece Tg is separated from the light shielding pattern LS. A buffer layer BUF is disposed on the substrate SUB to cover the light shielding pattern LS and the touch electrode piece Tg.

There are a semiconductor active layer SA of the switching thin film transistor ST and a semiconductor active layer DA of the driving thin film transistor DT on the buffer layer BUF to be separated from each other. There is an interlayer insulation film ILD on the buffer layer BUF to cover the semiconductor active layer SA and DA.

There are a data line DL, a source electrode SSE and a drain electrode SDE of the switching thin film transistor ST, and a source electrode DSE and a drain electrode DDE of the driving thin film transistor DT on the interlayer insulation film ILD. The data line DL is connected to the touch electrode piece Tg exposed through a first contact hole CH1 passing through the interlayer insulation film ILD and the buffer layer BUF.

There are a first insulation layer INS1 on the interlayer insulation film ILD to cover the source and drain electrodes SSE and SDE of the switching thin film transistor ST, and the source and drain electrodes DSE and DDE of the driving thin film transistor DT.

There is a color filter CF in each pixel region on the first insulation layer INS1. There is a second insulation layer INS2 on the first insulation layer INS1 to cover the color filter CF.

There is a pixel electrode Px as an anode electrode of an organic light emitting diode OLED on the second insulation layer INS2. The pixel electrode Px is connected to the drain electrode DDE of the driving thin film transistor DT exposed through a second contact hole CH2 passing through the interlayer insulation film ILD and the buffer layer BUF.

There is a bank layer BN on the second insulation layer INS2. The bank layer BN has openings exposing each pixel electrode Px.

Next, another example of the pixel structure of the touch sensor integrated type display device according to the embodiments of this disclosure will be described in more detail with reference to FIGS. 13 to 14B.

Figure 13:
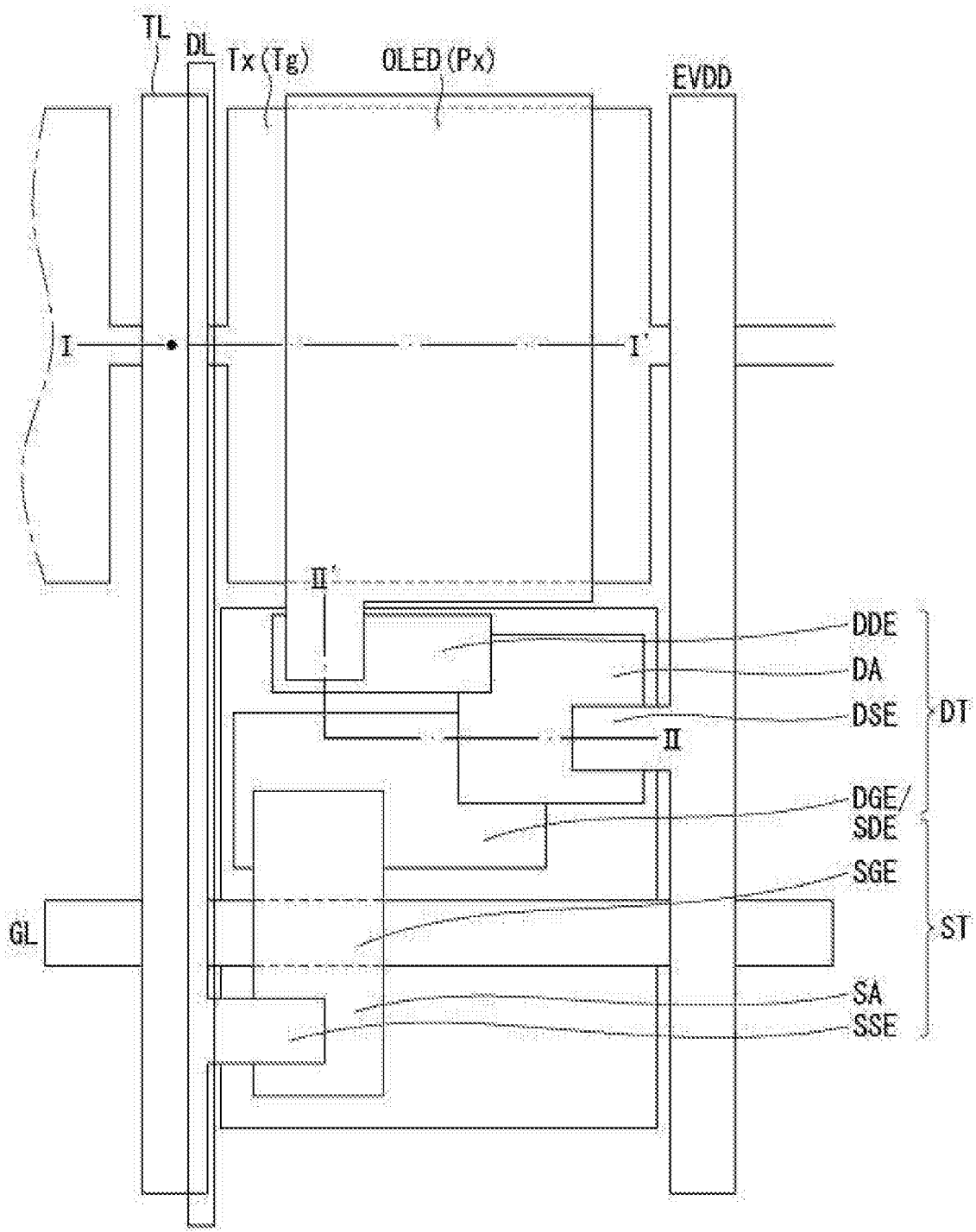
FIG. 13 is a plan view schematically showing another example for one pixel of the touch sensor integrated type electroluminescent display device shown in FIG. 10.
Figure 14A:
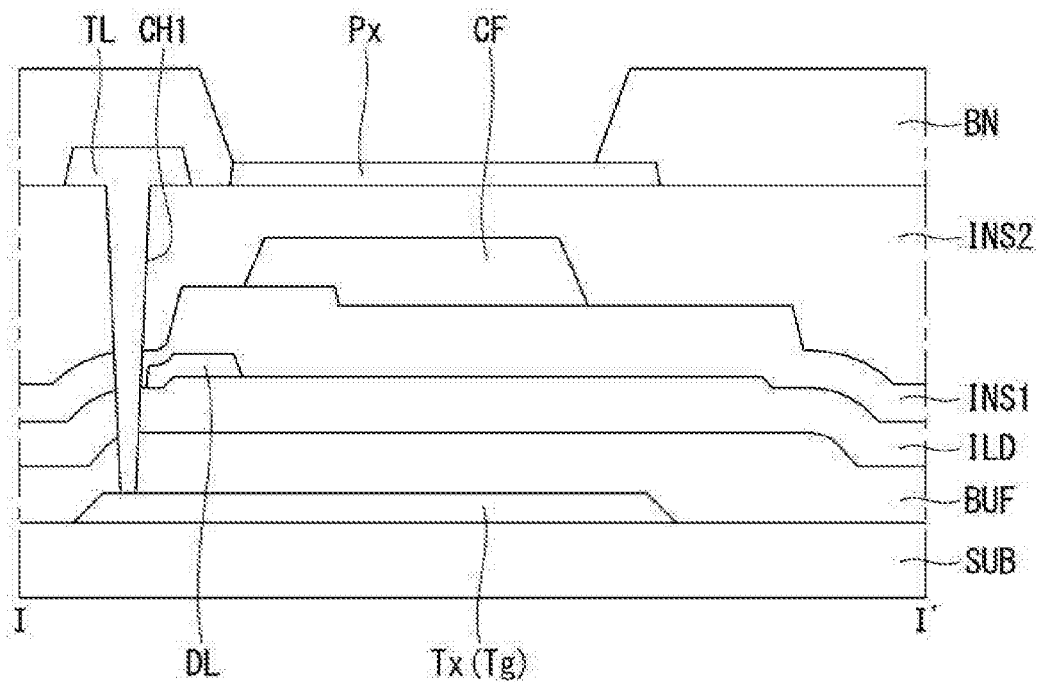
FIG. 14A is a cross-sectional view taken along line I-I' of FIG. 13.

FIG. 13 is a plan view schematically showing another example for one pixel of the touch sensor integrated type electroluminescent display device shown in FIG. 10. FIG. 14A is a cross-sectional view taken along line I-I' of FIG. 13, and FIG. 14B a cross-sectional view taken along line II-II' of FIG. 13.

Referring to FIG. 13, the touch sensor integrated type display device according to the embodiments of this disclosure includes a plurality of pixel regions. There are a gate line GL, a data line DL, a first voltage supplying line for supplying a high potential voltage EVDD, a second voltage supplying line for supplying a low potential voltage EVSS, a touch line TL, a cell driving unit, a pixel electrode Px of an organic light emitting diode OLED, and a touch electrode piece Tg of a touch electrode Tx connected to the touch line TL in each pixel region.

The cell driving unit includes a switching thin film transistor ST, a driving thin film transistor DT and a storage capacitor.

The switching thin film transistor ST includes a gate electrode SGE which is a portion of the gate line GL, a source electrode SSE extended from the data line DL, and a drain electrode SDE separated from the source electrode SDE.

The driving thin film transistor DT includes a source electrode DSE extended from the first voltage supplying line, a gate electrode DGE which is also the drain electrode SDE, and a drain electrode DDE connected to the pixel electrode Px.

Figure 14B:
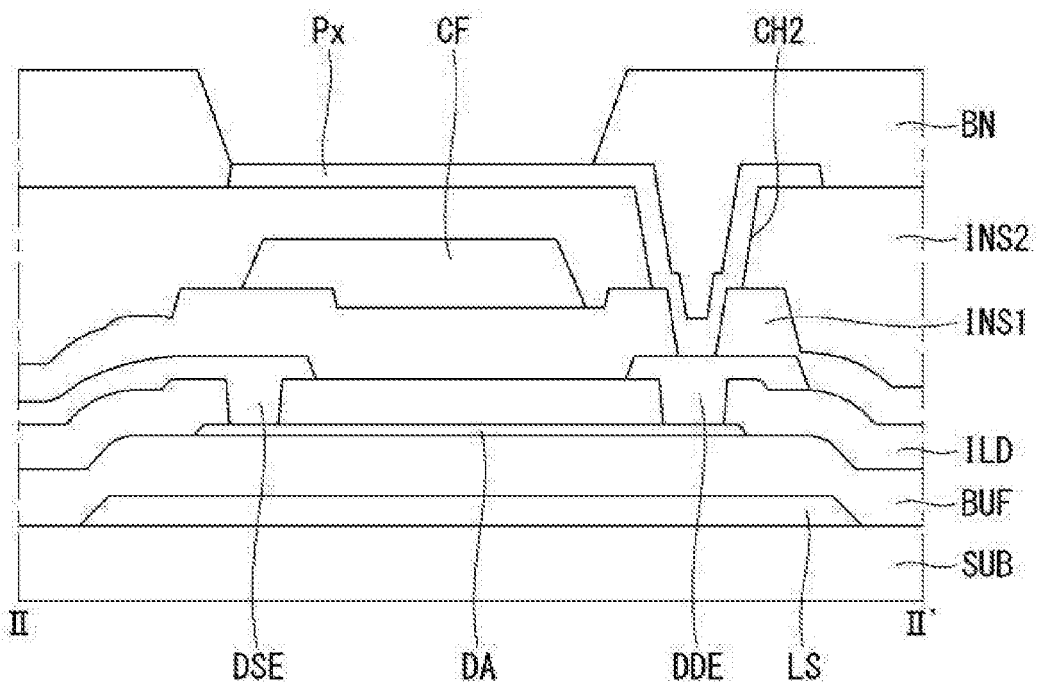
FIG. 14B is a cross-sectional view taken along line II-II' of FIG. 13.

Referring to FIGS. 14A and 14B, there are a light shielding pattern LS and a touch electrode piece Tg on a substrate SUB. The touch electrode piece Tg is separated from the light shielding pattern LS. A buffer layer BUF is disposed on the substrate SUB to cover the light shielding pattern LS and the touch electrode piece Tg.

There are a semiconductor active layer SA of the switching thin film transistor ST and a semiconductor active layer DA of the driving thin film transistor DT on the buffer layer BUF to be separated from each other. There is an interlayer insulation film ILD on the buffer layer BUF to cover the semiconductor active layer SA and DA.

There are a data line DL, a source electrode SSE and a drain electrode SDE of the switching thin film transistor ST, and a source electrode DSE and a drain electrode DDE of the driving thin film transistor DT on the interlayer insulation film ILD.

There are a first insulation layer INS1 on the interlayer insulation film ILD to cover the source and drain electrodes SSE and SDE of the switching thin film transistor ST, and the source and drain electrodes DSE and DDE of the driving thin film transistor DT.

There is a color filter CF in each pixel region on the first insulation layer INS1. There is a second insulation layer INS2 on the first insulation layer INS1 to cover the color filter CF.

There are a pixel electrode Px as an anode electrode of an organic light emitting diode OLED and a touch line TL on the second insulation layer INS2. The touch line TL is connected to the touch electrode piece Tg exposed through a first contact hole CH1 passing through the second insulation layer INS2, the first insulation layer INS1, the interlayer insulation film ILD and the buffer layer BUF. The pixel electrode Px is connected to the drain electrode DDE of the driving thin film transistor DT exposed through a second contact hole CH2 passing through the second insulation layer INS2 and the first insulation layer INS1.

There is a bank layer BN on the second insulation layer INS2. The bank layer BN has openings exposing each pixel electrode Px.

According to the touch sensor integrated type electroluminescence display device according to the embodiments of the present invention described above, it is possible for the touch electrode to be prevented from being damaged and also to be easily applied even in a high temperature process, because the touch electrode is disposed inside the encapsulator to be prevented from being exposed to the outside.

Those skilled in the art will understand that the disclosure may be changed and modified in various ways without departing from the technical spirit of the disclosure through the aforementioned contents.

For example, in FIGS. 11 and 13, the light-shielding pattern LS and the touch electrode piece Tx in one pixel area are not electrically connected to each other, but the disclosure is not limited thereto. The light shielding pattern LS and the touch electrode piece Tx in one pixel region may be electrically connected to each other through a bridge electrode. In this instance, since the touch sensing area is increased by the area of the light shielding pattern LS, the touch accuracy can be increased.

Accordingly, the technical scope of the present invention is not limited to the contents described in the detailed description of the specification, but should be determined by the claims.

What is claimed is:

1. A touch sensor integrated type electroluminescence display device comprising:
    a plurality of data lines and a plurality of gate lines crossing over each other;
    a plurality of pixel electrodes to which data signals are supplied through the plurality of data lines; and
    a touch electrode configured to overlap the plurality of pixel electrodes, wherein a touch driving signal is supplied to the touch electrode and then a touch position is detected from sensing the touch electrode,
    wherein the touch electrode includes a plurality of touch electrode sections connected to each other in a vertical direction and a horizontal direction by connection portions integral with the plurality of touch electrode sections, and the each of the plurality of touch electrode sections is disposed to correspond to each of the plurality of pixel electrodes, respectively, so that the each of the plurality of touch electrode sections is overlapped with one of the plurality of pixel electrodes, respectively,
    wherein the each of the plurality of touch electrode sections has a size substantially equal to that of one of the plurality of pixel electrodes of a corresponding color among red, green, blue and white,
    wherein the connection portions include first connection portions connecting all touch electrode sections in a column arranged along each of the data lines, and second connection portions connecting all touch electrode sections in a row arranged along each of the gate lines, and
    wherein the second connection portions are contacted to at least one data line of the plurality of data lines or a touch line via a contact hole.

2. The touch sensor integrated type electroluminescence display device of claim 1, wherein the touch driving signal is supplied to the touch electrode through the plurality of data lines.

3. The touch sensor integrated type electroluminescence display device of claim 1, further comprising the touch line in parallel with at least one of the plurality of data lines, wherein the touch driving signal is supplied to the touch electrode through the touch line.

4. The touch sensor integrated type electroluminescence display device of claim 3, wherein the touch line is overlapped with at least one of the plurality of data lines.

5. The touch sensor integrated type electroluminescence display device of claim 1, wherein adjacent touch electrode sections that neighbor each other among the plurality of touch electrode sections are connected by a connection portion among the connection portions, and the connection portion has a width narrower than that of the adjacent touch electrode sections at a crossing of the connection portion and a data line among the plurality of data lines.

6. The touch sensor integrated type electroluminescence display device of claim 1, further comprising a source and touch driver which supplies the data signals to the plurality of data lines and supplies the touch driving signal to the touch electrode.

7. The touch sensor integrated type electroluminescence display device of claim 6, wherein the source and touch driver selectively supplies one of the data signals and the touch driving signal to the plurality of data lines through a multiplexer.

8. The touch sensor integrated type electroluminescence display device of claim 7, wherein the source and touch driver supplies the data signals to the plurality of data lines through the multiplexer, and supplies the touch driving signal to the touch electrode through the touch line.

9. The touch sensor integrated type electroluminescence display device of claim 7, wherein the source and touch driver:
    supplies the data signals to the plurality of data lines during a display operation period of the touch sensor integrated type electroluminescence display device, and
    supplies the touch driving signal to the plurality of data lines, and supplies a load free driving signal having a phase and an amplitude that are the same as the touch driving signal to the plurality of gate lines during a touch operation period of the touch sensor integrated type electroluminescence display device,
    wherein the display operation period and the touch operation period are obtained by time-dividing one frame period of the touch sensor integrated type electroluminescence display device.

10. The touch sensor integrated type electroluminescence display device of claim 1, wherein the plurality of data lines and the plurality of gate lines define a plurality of pixel regions that correspond to the plurality of pixel electrodes, and
    wherein the plurality of touch electrode sections coincide with the plurality of pixel regions, respectively.

11. The touch sensor integrated type electroluminescence display device of claim 1, further comprising a color filter interposed between the plurality of pixel electrodes and the touch electrode.

12. The touch sensor integrated type electroluminescence display device of claim 1, further comprising a light shielding section apart from the plurality of touch electrode sections in pixel areas defined by crossings of the plurality of data lines and the plurality of gate lines.

13. The touch sensor integrated type electroluminescence display device of claim 12, wherein the light shielding section and the plurality of touch electrode sections are connected to each other by a connection portion among the connection portions.

14. The touch sensor integrated type electroluminescence display device of claim 3, wherein the plurality of data lines and the plurality of gate lines define a plurality of pixel areas corresponding to the plurality of pixel electrodes,
wherein each of the plurality of pixel areas includes a light emitting portion and a cell driving portion connected to one data line and one gate line and configured to control light emitting quantity of the light emitting portion,
wherein the touch line supplies the touch driving signal to the touch electrode, and supplies a reference voltage to the cell driving portion, and
wherein the touch driving signal and the reference voltage are supplied by time-dividing one frame period of the touch sensor integrated type electroluminescence display device.

15. The touch sensor integrated type electroluminescence display device of claim 14, wherein the touch sensor integrated type electroluminescence display device is driven by time-dividing the one frame period into a display operation period, a touch operation period, and a compensation operation period,
wherein scan signals are supplied to the plurality of gate lines, and the data signals are supplied to the plurality of data lines during the display operation period,
wherein the touch driving signal is supplied to the touch line, and a load free driving signal having a phase and an amplitude that are the same as the touch driving signal is supplied to the plurality of gate lines and the plurality of data lines during the touch operation period, and
wherein the scan signals are supplied to the plurality of gate lines, the data signals are supplied to the plurality of data lines, and a sensing signal is supplied to the touch line during the compensation operation period.

16. A touch sensor integrated type electroluminescence display device comprising:
a plurality of data lines and a plurality of gate lines crossing over each other to define a plurality of pixel regions;
a plurality of pixel electrodes connected to the plurality of data lines, the plurality of pixel electrodes coinciding with the plurality of pixel regions, respectively; and
a touch electrode coinciding with the plurality of pixel regions so that a touch position is detected from sensing the touch electrode,
wherein the touch electrode includes a plurality of touch electrode sections connected to each other in a vertical direction and horizontal direction by connection portions integral with the plurality of touch electrode sections, and the each of the plurality of touch electrode sections is disposed to correspond to each of the plurality of pixel electrodes, respectively so that each of the plurality of touch electrode sections is overlapped with one of the plurality of pixel electrodes, respectively,
wherein the each of the plurality of touch electrode sections has a size substantially equal to that of one of the plurality of pixel electrodes of a corresponding color among red, green, blue and white,
wherein the connection portions include first connection portions connecting all touch electrode sections in a column arranged along each of the data lines, and second connection portions connecting all touch electrode sections in a row arranged along each of the gate lines, and
wherein the second connection portions are contacted to at least one data line of the plurality of data lines or a touch line via a contact hole.

17. The touch sensor integrated type electroluminescence display device of claim 16, wherein data signals are supplied to the plurality of data lines and touch driving signals are supplied to the touch electrode simultaneously during one frame period of the touch sensor integrated type electroluminescence display device.

18. The touch sensor integrated type electroluminescence display device of claim 16, wherein data signals are supplied to the plurality of data lines during a display operation period, and a touch driving signal is supplied to the touch electrode during a touch operation period, and a load free driving signal having a phase and an amplitude that are the same as the touch driving signal is supplied to the plurality of gate lines and data lines during a touch operation period, and
wherein the display operation period and the touch operation period are obtained by time-dividing one frame period of the touch sensor integrated type electroluminescence display device.

19. The touch sensor integrated type electroluminescence display device of claim 1, wherein the first connection portions cross over the gate lines and have a first width narrower than a second width of a touch electrode section connected to the first connection portions at a crossing region of the first connection portions and the gate lines, and
wherein the second connection portions cross over the data lines and have a third width narrower than a fourth width of the touch electrode section connected to the second connection portions at a crossing region of the second connection portion and the date lines.

20. The touch sensor integrated type electroluminescence display device of claim 16, wherein the first connection portions cross over the gate lines and have a first width narrower than a second width of a touch electrode section connected to the first connection portions at a crossing region of the first connection portions and the gate lines, and
wherein the second connection portions cross over the data lines and have a third width narrower than a fourth width of the touch electrode section connected to the second connection portions at a crossing region of the second connection portions and the date lines.

* * * * *